United States Patent [19]

Graeme et al.

[11] Patent Number: 4,596,958
[45] Date of Patent: Jun. 24, 1986

[54] DIFFERENTIAL COMMON BASE AMPLIFIER WITH FEED FORWARD CIRCUIT

[75] Inventors: Jerald G. Graeme; Steven D. Millaway, both of Tucson, Ariz.

[73] Assignee: Burr-Brown Corporation, Tucson, Ariz.

[21] Appl. No.: 654,959

[22] Filed: Sep. 26, 1984

[51] Int. Cl.[4] .............................................. H03F 3/45
[52] U.S. Cl. .................................. 330/253; 330/151; 330/258; 330/300
[58] Field of Search ............... 330/151, 253, 257, 258, 330/277, 300

[56] References Cited

PUBLICATIONS

Jaeger, "High-Performance Input, Stage for Integrated Operational Amplifiers", *IBM Technical Disclosure Bulletin*, vol. 18, No. 6, Nov. 1975, pp. 1695, 1696.

*Primary Examiner*—James B. Mullins
*Attorney, Agent, or Firm*—Cahill, Sutton & Thomas

[57] ABSTRACT

A differential common base amplifier circuit includes first and second source follower field effect transistors that apply a differential input signal between the emitters of first and second bipolar transistors having a common base connection. An output circuit connected to the collector of the first bipolar transistor includes a bipolar emitter follower transistor having its emitter connected to a first field effect transistor which is connected to the emitter of the emitter follower transistor. The gate of the first field effect transistor is connected to the gate of one of the source follower field effect transistors. Process-caused variations in the gate to source voltage characteristic of the second source follower field effect transistor and the first field effect transistor are applied equally to the emitter and collector of the second bipolar transistor. This avoids input offset errors due to base width variations in the second bipolar transistor. Feed-forward signals coupled to the emitter of the emitter follower transistor in response to the input signal prevent roll off of the frequency response of the differential common base amplifier, due to the high frequency response of the emitter follower transistor when operated in what is, in effect, a common base configuration.

19 Claims, 5 Drawing Figures

DIFFERENTIAL COMMON BASE AMPLIFIER WITH FEED FORWARD CIRCUIT

BACKGROUND OF THE INVENTION

The invention relates to differential common base amplifier circuits, especially of the type having field effect transistor input stages, and more particularly to circuitry for preventing variations in the gate to source voltage characteristics of the field effect transistors from causing variations in the input offset voltages of the differential common base amplifier circuits, and still more particularly to techniques for preventing roll off of the frequency response of differential common base amplifier circuits.

Several differential common base amplifiers are known, and have various advantages, including optimum bandwidth that results from the use of the common base connection of bipolar transistors. I.e., differential common base amplifiers have high frequency response because the common base connection of a bipolar transistor has superior bandwidth characteristics. However, since the "input characteristics" of a common base connection of a bipolar transistor have various shortcomings, including the disadvantage that the input impedance of a common base connected transistor at its emitter terminal is low, its DC input current is high and its associated noise current is high. For these reasons, it is common to drive the two inputs of a common base differential input stage with emitter follower circuits. The input impedance of such follower circuits is very high, resulting in fairly low input currents and low associated noise currents. But it would be very desirable for certain low noise applications to have lower noise currents than is achievable with bipolar emitter followers. Ordinarily, JFET input circuitry would be used to achieve low noise operation, but, for the reasons subsequently explained, JFET source followers are incompatible with common base differential input circuitry.

Before describing the limitations of common base differential input stages driven by source follower circuits it will be helpful to briefly describe the structure and shortcomings of such a device with reference to FIG. 5 of the appended drawings. Referring now to FIG. 5, reference numeral 40 designates a typical prior art, common base differential input stage including two NPN transistors 8 and 9 having their bases connected together. The base of transistor 8 is connected to its collector and to a constant current source circuit 12. Typically the output of a bipolar emitter follower (not shown) is connected to the emitter of transistor 8. Similarly the collector of transistor 9 is connected to a second current source 13. Typically, the output of another emitter follower is connected to the emitter of transistor 9. The collector of NPN transistor 9 is coupled by means of conductor 11 to the base of an NPN output transistor 14. The emitter of transistor 14 is normally connected to a relatively constant voltage source circuit which is schematically represented by a battery having a voltage $V_B$ in FIG. 5. The collector of output transistor 14 is connected to a constant current source load circuit 18. The constant current sources of circuits 12, 13, and 18 can be lateral PNP current mirror circuits, which have high dynamic resistance, and are well known to those skilled in the art. An output voltage $V_O$ is produced on the collector of output transistor 14.

It is desirable that transistor 14 be an NPN transistor, even though for simple biasing, a PNP transistor would be better because lateral PNP transistors that can be fabricated in conventional bipolar integrated circuit manufacturing processes commonly used for linear integrated circuits have very low frequency response.

It would be desirable to use FET source followers, as shown in FIG. 5, in order to achieve low noise operation. But, unfortunately, in the circuit shown in FIG. 5, wherein the voltage at the emitter of transistor 14 is relatively constant, and source followers 4 and 5 are used as shown, if there are shifts in the gate-to-source voltage characteristic of JFET (junction field effect transistors) 4 caused by variations in integrated circuit processing variations or by variations in operating temperature of the circuit, such variations in the gate-to-source voltage characteristic of field effect transistor 4 result in a corresponding change in the voltage on the bases of NPN transistors 8 and 9. Since the voltage of the emitter, and hence also of the base, of output transistor 14 remains relatively constant, there is an equal change in the collector to base voltage of transistor 9. Shifts of one to three volts in the gate-to-source voltage characteristic of junction field effect transistors are common for bipolar integrated circuit manufacturing processes that are most commonly used. (The "gate-to-source voltage characteristic" is value of the gate-to-source voltage $V_{GS}$ of the JFET for a predetermined drain current.) Obviously, such voltage variations, when imposed on the collector-to-base voltage of transistor 9, but not transistor 8, result in unacceptable variations of 0.3 to 1.2 millivolts in the input offset voltage of the differential pair of transistors 8 and 9, since input offset errors of more than 0.1 millivolts are usually unacceptable.

This mismatch between the collector-to-base voltages of transistors 8 and 9 results in an input offset voltage caused by the above-mentioned shifts in the gate-to-source voltage characteristic of the field effect transistor 4, of base width modulation in transistor 9. This input offset voltage could be multiplied by the stage of gain including transistor 9 and current source 13, followed by the stage including transistor 14 and constant current source 18.

Furthermore, any common mode voltage component of $V_{in1}$ and $V_{in2}$ similarly causes a corresponding change in the collector-to-base voltage of transistor 9; the resulting base-width modulation of transistor 9 does not occur in transistor 8, so input offset errors occur in the differential stage including transistors 8 and 9 and are amplified by the high gain of the circuit.

Because of these obvious problems, no one is known to have used source follower input circuitry in a differential common base amplifier to obtain low noise, high gain performance.

Thus, there remains an unmet need for a simple, easily fabricated differential common base amplifier circuit with very low noise performance, and for such a circuit that makes it possible to conveniently take advantage of the high frequency response characteristics of a bipolar NPN integrated circuit connected in a common base configuration.

SUMMARY OF THE INVENTION

Accordingly, it is an object of the invention to provide a simple, easily fabricated differential common base amplifier having very high input impedance and very low noise operation and low input offset errors despite normal shifts in operating temperature or manufacturing parameters for linear integrated circuits.

It is another object of the invention to provide a very high input impedance differential common base amplifier circuit which has a very low input offset voltage characteristic.

It is another object of the invention to provide a simple, accurate, extremely high frequency, high input impedance differential common base amplifier circuit which is very independent of fabrication-induced parameter variations.

Briefly described, and in accordance with one embodiment thereof, the invention provides a differential common base amplifier circuit including first and second bipolar transistors having their base electrodes connected together, first and second high impedance load devices coupled to their collectors, first and second input voltage follower circuits having outputs coupled to the emitters of the first and second bipolar transistors, the collector of the first bipolar transistor being coupled to produce a bias voltage on the common bases of the first and second bipolar transistors, the collector of the second transistor being coupled to a third bipolar transistor, a first input voltage being applied to the input of a transistor of the first voltage follower circuit and also being applied to a corresponding input of a transistor of a third voltage follower circuit, the output of which is connected to the emitter of the third bipolar transistor. In the described embodiment of the invention, the first and second transistors are NPN transistors, the first and second load circuits are constant current source circuits, such as lateral PNP current mirror circuits. The first, second, and third voltage follower circuits include first, second, and third P-channel junction field effect transistors having their sources connected, respectively, to the emitters of the first, second and third bipolar transistors. The collector of the third NPN transistor is connected to a third high impedance current source circuit and produces a second output. In one described embodiment of the invention, variations in the gate-to-source voltage characteristic of the first and second P-channel field effect transistors are matched by corresponding variations in the gate to source voltage of the third P-channel field effect transistor, and therefore such changes are equally impressed upon the base electrodes of the second and third NPN transistors. Consequently, there is no base width modulation of the second NPN transistor, and no variation in input offset voltage of the differentially connected first and second NPN transistors is produced. For high frequency operation, the voltage applied to the gate electrode of the first P-channel field effect transistor is "fed forward" to the emitter of the third NPN transistor with substantially higher frequency response than occurs for the primary signal path through the differential input stage of the circuit. This decreases "roll off" of the frequency response of the circuit. The use of the third voltage follower circuit to the emitter of the third NPN transistor allows that emitter to be utilized as a source follower output in which a signal is produced which is 180° out of phase with the output signal produced on a collector of the third NPN transistor.

DESCRIPTION OF THE INVENTION

Figure 1:
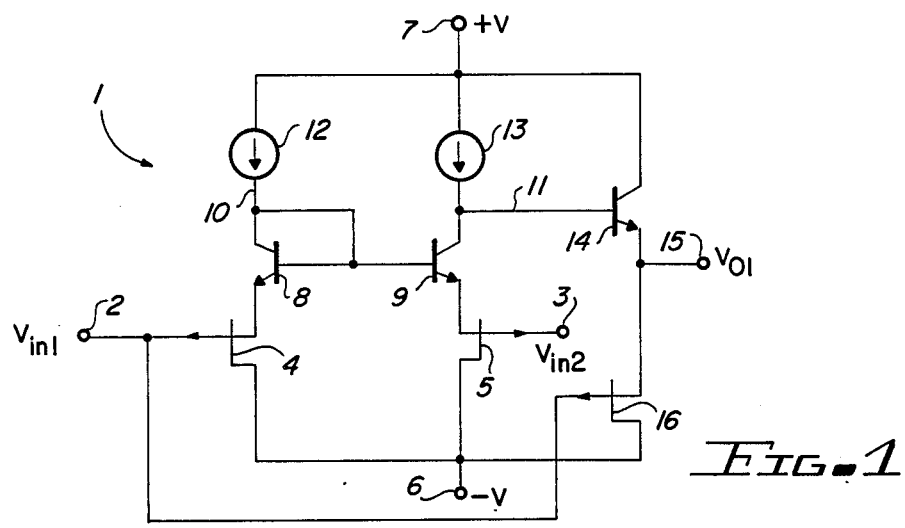
FIG. 1 is a schematic circuit diagram of one embodiment of the invention.

Referring first to FIG. 1, the differential common base amplifier circuit 1 of the present invention is similar to the circuit previously described with reference to FIG. 5, except that the circuit represented by battery $V_B$ has been replaced by a P-channel field effect transistor 16 having its gate electrode connected to conductor 2, the conductor to which the input voltage $V_{in1}$ is applied. I.e., NPN transistors 8 and 9 are connected with their bases common and their emitters connected to the sources of P-channel JFETs 4 and 5, respectively. $V_{in1}$ and $V_{in2}$ are applied by conductors 2 and 3 to the gates of JFETs 4 and 5, respectively. The collector of transistor 8 is connected to its base and to high impedance current source 12. The collector of transistor 9 is connected to high impedance current source 13 and to the base of NPN transistor 14, the collector of which is connected to +V. The emitter of transistor 14 is connected to the source of P-channel JFET 16, the gate of which is connected to conductor 2. The drains of JFETs 4, 5, and 16 are all connected to −V voltage supply conductor 6. The output of differential common base amplifier 1 is produced on conductor 15, which is connected to the emitter of NPN output transistor 14 and to the source of field effect transistor 16. Therefore, output transistor 14 operates as an emitter follower.

Figure 2:
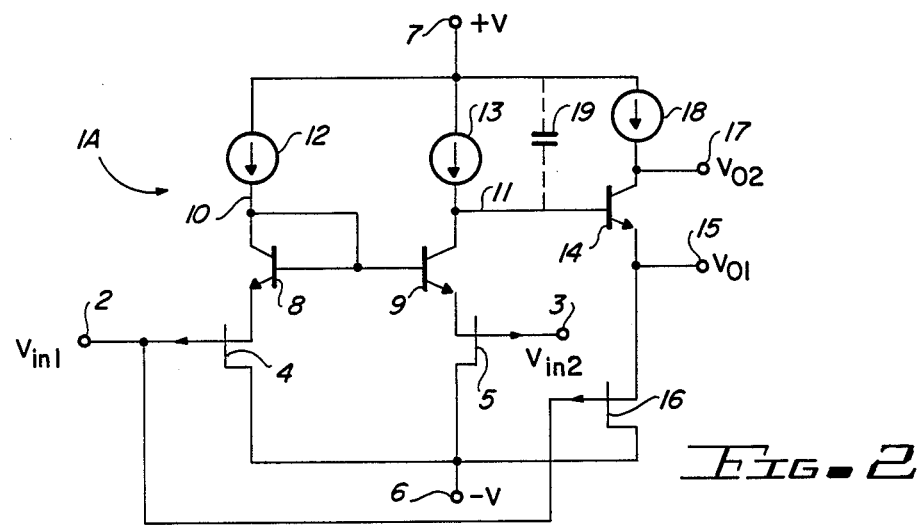
FIG. 2 is a schematic circuit diagram of another embodiment of the invention.

Another embodiment of the invention, shown in FIG. 2, is identical to the one shown in FIG. 1 except that constant current source circuit 18 is connected between the collector of output transistor 14 and +V conductor 7, and an output conductor 17 which is connected to the collector of transistor 14 producing a second output voltage $V_{O2}$.

Figure 3:
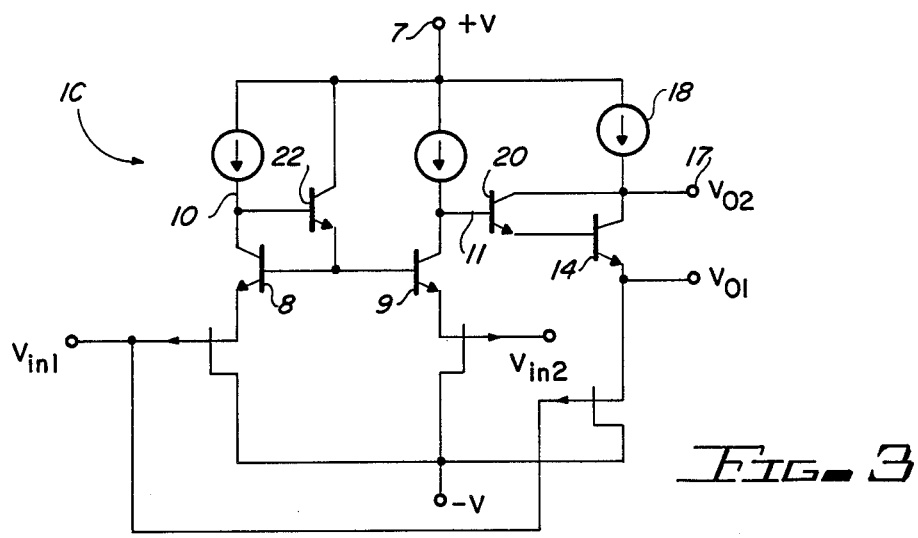
FIG. 3 is a circuit schematic diagram of a third embodiment of the invention.
Figure 4:
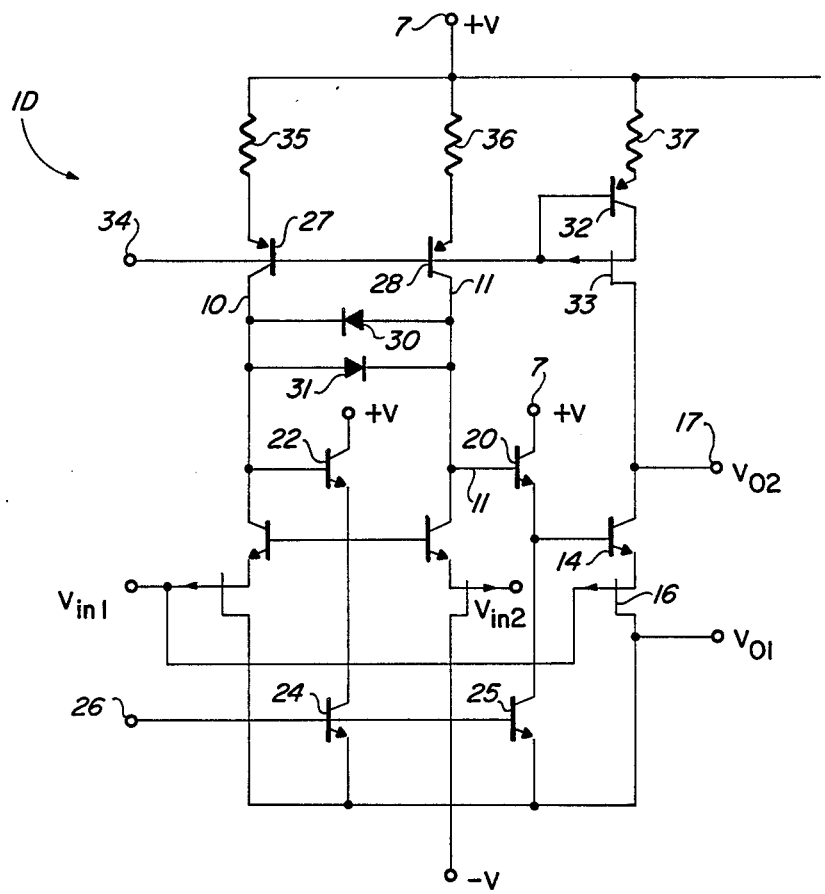
FIG. 4 is a schematic circuit diagram of a fourth embodiment of the invention.

The main advantageous characteristics of the present invention can be described with reference to FIGS. 1 and 2. Additional variations on the concept of the invention are shown in the implementations of FIGS. 3 and 4, subsequently explained.

Figure 5:
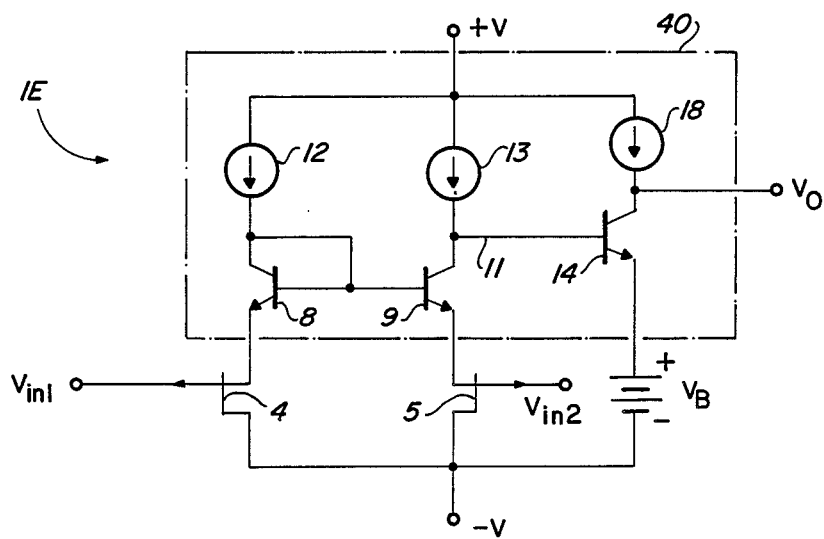
FIG. 5 is a schematic circuit diagram useful in explaining the shortcomings of the prior art.

To describe the benefits of eliminating the relatively constant bias circuit or reference circuit represented by battery $V_B$ in FIG. 5 with the P-channel JFET 16 shown in FIGS. 1–4, it is convenient to give several examples in which it is assumed that there is a zero common mode component of the input voltage applied to conductors 2 and 3. It is also assumed that NPN transistors 8 and 9 are nearly perfectly matched, as can be readily achieved at the present state of the art of the bipolar integrated circuit manufacturing technology. It is also assumed that on a particular integrated circuit chip, the gate-to-source voltage ($V_{GS}$) parameters of each of the JFETs 4, 5, and 16 can be very precisely matched. Again, at the present state of the art, this is a very realistic assumption. However, the chip to chip variation in the value of the matched $V_{GS}$ clockwise values may vary by as much as approximately three volts.

One of the objectives of the addition of JFET 16 is to cause any change in the value of the characteristic of JFETs 4 and 5 on the emitters of NPN transistors 8 and 9, respectively, to have the same net effect on both the collector voltage and the base voltage of NPN transistor 9. As mentioned above, any variation in the collector to base voltage of NPN transistor 9 produces an input offset error in the circuit including the differential common base connection of transistors 8 and 9, because of the base width modulation that occurs in transistor 9. Such an input offset error is multiplied by the very high gain of the amplification stage including NPN transistor 9 and high impedance constant current source circuit 13, and, if the output is taken at conductor 17, is further amplified by a second high gain stage including NPN transistor 14 and high impedance current source 18.

It is assumed that the current through current sources 12 and 13 are equal, or that the emitter geometries of transistors 8 and 9 are ratioed in the same fashion as the ratio between the current sources 12 and 13, and that the geometries of JFETs 4, 5, and 16 are ratioed in accordance with their quiescent operating currents, so that their $V_{GS}$ characteristics are very closely matched.

Since the collector-to-base voltage of NPN transistor 8 is zero (by virtue of the short circuit connection), the collector to base voltage of NPN transistor 9 also needs to be zero, despite any temperature-induced or process-induced variations in the characteristics of JFETs 4, 5, and 16, if the circuits of FIGS. 1-4 are to have low input offset voltages and high common mode rejection and high common mode range. As previously mentioned, these process-caused variations in the $V_{GS}$ parameters of the JFETs can be up to three volts for different wafers from which the individual chips are produced during the manufacturing operation. However, on a particular chip, the $V_{GS}$ parameters of all of the JFETs 4, 5, and 16 will be very closely matched.

As an example of how the circuits of FIGS. 1-4 avoid input offset errors as a result of variations in the $V_{GS}$ parameters of the JFETs, assume that $V_{GS}$ for a particular chip is 1 volt for JFETs 4, 5, and 16, and that the common mode voltage applied to inputs 2 and 3 is zero volts. Then the voltage on the sources of JFETS 4, 5, and 16 will be $-1$ volt; this will also be the voltage on the emitters of NPN transistors 8, 9, and 14. The base-to-emitter ($V_{BE}$) voltages of each of the NPN transistors 8, 9, and 14 are closely matched (typically within 0.2 millivolts), the voltages on conductors 10 and 11 will be $-1$ volt plus the respective $V_{BE}$ voltages (which typically are approximately 0.6 volts), and the collector to base voltage of NPN transistor 9 will be zero volts, the same as for NPN transistor 8. Therefore, there will be no input offset error.

Next, assume that on a different chip, the $V_{GS}$ parameter of JFETS 4, 5, and 16 is 3 volts different than in the first example, or $+4$ volts. Again, the voltages on conductors 10 and 11 will be $-4$ volts plus $V_{BE}$ volts; the collector-to-base voltage $V_{CB}$ of transistor transistor 9 will again be zero volts. Therefore, it can be seen that throughout the range of likely variations in the $V_{GS}$ parameter of JFETs 4, 5 and 16, the collector-to-base voltage of NPN transistor 9 will remain at zero volts, so there will be no input offset error.

Thus, it can be seen that the above-mentioned very undesirable variation of input offset voltage that would be expected if integrated JFET source followers are used as input stages for the differential common base NPN transistor circuit 40 in FIG. 5 is completely avoided by using a JFET 16 that matches JFETs 4 and 5, rather than an emitter follower resistor or a relatively constant emitter bias circuit such as the one represented symbolically by letter $V_B$ if FIG. 5.

The foregoing analysis applies equally well to temperature-induced variations in the $V_{GS}$ parameters of JFETs 4, 5, and 16 as to process-induced variations, since these JFETs will all normally be at precisely the same temperature.

From the foregoing analysis, one skilled in the art will be able to readily see that any change in the common mode voltage applied to conductors 2 and 3 will produce exactly the same effect on conductor collector 11, as a result of the presence of JFET 16, as is produced on collector conductor 10 as a result of the source follower operation of JFET 4. Consequently, the embodiments of the invention shown in FIGS. 1-4 all have exceptionally high common mode rejection and common mode range. Common mode range is increased greatly over the circuit of FIG. 5, since in that circuit the emitter of transistor 14, and hence, conductor 11 are fixed at plus $V_{BE}$. In the circuits of FIGS. 1-4, voltage on the collectors of transistors 8 and 9 track precisely with the common mode voltage applied to input conductors 2 and 3, until the current source circuits 12 and 13 become non-linear. The low frequency gain from the inputs to the $V_{02}$ output is approximately 100,000, and the bandwidth is several hundred megahertz, which is an order of magnitude greater than could be achieved without the "feed forward" operation.

The reader who is not familiar with the details of input offset voltage of differential circuits and with the concepts of common mode rejection and common mode range is referred to the text "Operational Amplifiers: Design and Applications", edited by one of the the present inventors, G. Tobey and L. Huelsman, and incorporated herein by reference.

Output voltages of the differential common base amplifier of FIGS. 2-4 can be taken at either the emitter of NPN transistor 14, on conductor 15, or at the collector of NPN transistor 14, on conductor 17 or both.

If the output $V_{02}$ is taken on conductor 17, then it is desirable that the high frequency impedance at the base of transistor 14 be as low as possible. Since the output impedance of both constant current source 13 and the collector of NPN transistor 9 are very high, it is necessary to reduce the effects of these high impedances by either adding a compensation capacitor, such as the one indicated by dotted lines 19 in FIG. 2, or by adding an emitter follower transistor such as 20 shown in FIGS. 3 and 4. In FIGS. 3 and 4, transistor 20 has its base connected to conductor 11 and its emitter connected to the base of NPN transistor 14. The collector of NPN transistor 20 can be connected to conductor 17, as shown in FIG. 3, or to the $+V$ conductor 7, as shown in FIG. 4. The emitter of transistor 20 can be connected solely to the base of NPN transistor 14 in the well known Darlington configuration as shown in FIG. 3, or to a constant current source transistor such as 25 in FIG. 4. In either case, the impedance at the base of transistor 14 is substantially decreased.

In both FIG. 3 and FIG. 4, it is necessary to replace the short circuit connection between the base and the collector of NPN transistor 8 with emitter follower transistor 22, so that the collector to base voltage of transistor 8 is the same as the collector to base voltage of transistor 9, i.e., one $V_{BE}$ voltage drop.

In accordance with the present invention, the addition of JFET 16 provides an additional important advantage that substantially increases the frequency response of the differential common base amplifier of the present invention. That advantage is to provide a "feed forward" signal in response to $V_{in1}$ wherein JFET 16 acts as a source follower that provides a replica of $V_{in1}$ as an input to the emitter of NPN transistor 14 just as JFET 4 provides a replica of $V_{in1}$ as an input to the emitter of transistor 8.

With respect to the signal produced by source follower JFET 16 as an input to the emitter of NPN transistor 14, NPN transistor 14 effectively operates as a grounded base transistor, which, as mentioned above, has a very high frequency response. The capacitance or low AC impedance associated with the base of transistor 14 causes that point to act as a "virtual ground" with respect to the small signal variations applied to the emitter of NPN transistor 14 in response to $V_{in1}$.

In FIG. 2, NPN transistor 14, operating as a high frequency common base amplifier in response to the feed forward replica of $V_{in1}$ on conductor 15 by source follower JFET 16, produces an amplified replica of having very frequency response on conductor 17. This high high frequency accuracy of the amplified "feed forward" signal component of $V_{02}$ greatly reduces the frequency response roll off of the net $V_{02}$ output signal.

Note that $V_{02}$ includes a "feed forward component" passing through JFET 16, and also another component having lower high frequency accuracy produced by the differential common base transistors 8 and 9 as a result of the signals produced at the emitters of transistors 8 and 9 by JFET source follower transistors 4 and 5, respectively. The frequency response of the signal path through JFET transistors 4 and 5 is much lower than the frequency response of the signal path through JFET 16 and NPN transistor 14 because of the lower gain of the latter path.

In FIG. 4, practical implementations of the current source circuits 12, 13, and 18 are shown. Constant current source 12 is implemented by means of a lateral PNP transistor 27 and an emitter ballast resistor 35. Current source 13 includes lateral PNP transistor 28 and emitter resistor 36. Current source 18 is implemented by a P-channel JFET 33 having its source connected to the collector of lateral PNP transistor 32. Emitter resistor 37 is connected between the emitter of transistor 32 and $+V$ supply voltage conductor 7. The base of transistor 32, the gate of JFET 33, and the bases of transistors 27 and 28 are connected to a fixed bias generated by an external circuit (not shown) that drives conductor 34 in FIG. 4.

In FIG. 4, diodes 30 and 31 act as clamping diodes which perform the function of improved overload recovery. NPN transistors 24 and 25 function as constant current sources for the emitter follower buffers that include NPN transistors 22 and 20, respectively.

Although the embodiments of the invention shown utilize source followers connected to the inputs of NPN transistors 8, 9, and 14, the above-described benefits of the invention could be accomplished using NPN emitter followers as well.

The above-described configuration provides the previously un-attainable benefit of very low noise operation in a differential input stage with very good common mode rejection, common mode voltage range, and low input offset voltage over the usual operating temperature range of $-55$ to $+125$ degrees Centigrade, and further provides very high bandwidth. These advantages have caused the assignee's OPA111 low noise Precision Operational Amplifier, which incorporates the present invention, to become one of the assignee's most commercially successful products in the short time since its introduction in December of 1983.

While the invention has been described with reference to a particular embodiment thereof, those skilled in the art will be able to make various modifications to the described structure and underlying method of operation without departing from the true spirit and scope of the invention. It is intended that all elements and methods which perform substantially the same function in substantially the same way to achieve the substantially the same result as the elements and method steps disclosed herein are to be encompassed within the invention.

We claim:

1. A differential common-base amplifier circuit, comprising in combination:
    (a) first and second transistors, each having a collector, a base, and an emitter;
    (b) means for coupling the base of said first and second transistors together;
    (c) first current source means coupled to the collector of said first transistor for supplying a collector current thereto, and second current source means coupled to the collector of said second transistor for supplying a collector current thereto;
    (d) a third transistor having a base coupled to the collector of said second transistor, a collector coupled to a third current source means, and an emitter;
    (e) a first field effect transistor having a gate electrode coupled to receive a first input signal, a source coupled to the emitter of said first transistor, and a drain coupled to a first supply voltage conductor, and a second field effect transistor having a gate electrode coupled to receive a second input signal, a source coupled to the emitter of said second transistor, and a drain coupled to said first supply voltage conductor; and
    (f) a third field effect transistor having a gate coupled to the gate of said first field effect transistor to receive the first input signal, a source coupled to the emitter of said third transistor, and a drain coupled to a reference voltage source, whereby a $V_{GS}$ characteristic of said second field effect transistor closely tracks with a $V_{GS}$ characteristic of said third field effect transistor so that variations in the voltage of the emitter of said second transistor due to variations in the $V_{GS}$ characteristic of said second field effect transistor are also produced at the collector of said second transistor in response to said third field effect transistor, thereby substantially eliminating changes in the collector to base voltage of said second transistor due to variations in the $V_{GS}$ characteristic of said second field effect transistor.

2. The differential common base amplifier of claim 1 wherein the base of said first transistor is connected to its collector and to the base of said second transistor by means of a conductor.

3. The differential common base amplifier of claim 1 wherein said third current source means includes a constant current source coupled to the collector of said third transistor.

4. The differential common base amplifier of claim 1 wherein said third current source means includes a conductor connecting the collector of said third transistor to a second supply voltage conductor.

5. The differential common base amplifier of claim 1 wherein the base of said third transistor is coupled to the collector of said second transistor by means of an emitter follower circuit.

6. The differential common base amplifier of claim 5 wherein said first, second, and third transistors are NPN transistors, and said emitter follower circuit includes a fourth NPN transistor.

7. The differential common base amplifier of claim 6 wherein said first, second, and third field effect transistors are P-channel field effect transistors.

8. The differential common base amplifier of claim 1 including emitter follower means for driving the base of said third transistor in response to voltage changes of the collector of said second transistor and for reducing the impedance presented to the base of said third transistor by said emitter follower means in order to cause said third transistor to operate at very high frequencies as a grounded base amplifier, whereby said third field effect transistor operates in response to said first input signal to reduce roll-off of the foregoing response of an output voltage produced by said differential common base amplifier at the emitter and/or the collector of said third transistor.

9. The differential common-base amplifier circuit of claim 1 including feed-forward circuit means for feeding said first input signal forward to the emitter of said third transistor, said feed-forward circuit means including said third field effect transistor.

10. The differential common-base amplifier of claim 9 including low impedance means coupled to the base of said third transistor for presenting a low impedance at high frequencies to the base of said third transistor to cause said third transistor to operate, in effect, as a common-base connected transistor in response to the signal fed-forward by said feed-forward circuit means.

11. The differential common-base amplifier circuit of claim 10 wherein said low impedance means includes an emitter follower coupled between the base of said third transistor and the collector of said second transistor.

12. A low noise differential common-base amplifier integrated circuit, comprising in combination:
(a) first and second NPN transistors, each having a collector, a base, and an emitter;
(b) first means for coupling the bases of said first and second NPN transistors together;
(c) a first current source coupled to the collector of said first NPN transistor and a second current source coupled to the collector of said second NPN transistor;
(d) a third NPN transistor having a base coupled to the collector of said second NPN transistor, a collector coupled to a third current source, and an emitter;
(e) a first P-channel field effect transistor having a gate electrode coupled to receive a first input signal, a source coupled to the emitter of said first NPN transistor, and a drain coupled to a first supply voltage conductor, and a second P-channel field effect transistor having a gate electrode coupled to receive a second input signal, a source coupled to the emitter of said second NPN transistor, and a drain coupled to said first supply voltage conductor; and
(f) a third P-channel field effect transistor having a gate coupled to the gate of said first P-channel field effect transistor, a source coupled to the emitter of said third NPN transistor, and a drain coupled to the first supply voltage conductor.

13. The low noise differential common-base amplifier integrated circuit of claim 12 wherein each of said first, second, and third current sources includes a lateral PNP transistor having its emitter coupled to a second supply voltage conductor and its collector coupled to the collector of a respective one of said first, second, and third NPN transistors.

14. The low noise differential common base amplifier integrated circuit of claim 12 wherein said first means includes a fourth NPN transistor having its base coupled to the collector of said first NPN transistor, its emitter coupled to the bases of said first and second NPN transistors, and its collector coupled to a source of voltage.

15. The low noise differential common-base amplifier integrated circuit of claim 14 wherein said second means includes a fifth NPN transistor having its base coupled to the collector of said second NPN transistor, its emitter coupled to the base of said third NPN transistor, and its collector coupled to a source of current.

16. The low noise differential common-base amplifier integrated circuit of claim 15 wherein a $V_{GS}$ characteristic of said second P-channel field effect transistor closely matches a $V_{GS}$ characteristic of said third P-channel field effect transistor.

17. A method for operating a differential common-base amplifier circuit to attain very low noise operation, said method comprising the steps of:
(a) providing first and second transistors, each having a collector, a base, and an emitter and coupling the bases of said first and second transistors together;
(b) coupling a first current source to the collector of said first transistor to supply a collector current thereto, and coupling a second current source to the collector of said second transistor to supply a collector current thereto;
(c) providing a third transistor having a base coupled to the collector of said second transistor, a collector coupled to a third current source means, and an emitter;
(d) applying a first input signal to a gate electrode of a first field effect transistor having a source coupled to the emitter of said first transistor, and a drain coupled to a first supply voltage conductor, and applying a second input signal to a gate electrode of a second field effect transistor having a source coupled to the emitter of said second transistor, and a drain coupled to the first supply voltage conductor; and
(e) also applying said first input signal to a gate electrode of a third field effect transistor having a source coupled to the emitter of said third transistor and a drain coupled to the first supply voltage conductor, whereby the $V_{GS}$ characteristic of said second field effect transistor closely tracks with the $V_{GS}$ characteristic of said third field effect transistor so that variations in the voltage of the emitter of said second transistor due to variations in the $V_{GS}$ characteristic of said second field effect transistor are also produced at the collector of said second transistor in response to said third field effect transistor, thereby substantially eliminating charges in the collector to base voltage of said second transistor due to variations in the $V_{GS}$ characteristic of said second field effect transistor.

18. The method of claim 17 including the steps of producing a low impedance at the base of said third transistor to cause said third transistor to function, in effect, as a common-base connected transistor in response to a high frequency signal applied to its emitter.

19. The method of claim 18 including the step of feeding said first input signal forward to the emitter of said third transistor by means of said third field effect transistor to reduce roll-off of the frequency response of said differential common-base amplifier circuit.

* * * * *